United States Patent [19]

Abernathy et al.

[11] Patent Number: 5,171,704

[45] Date of Patent: Dec. 15, 1992

[54] GAAS DEVICE FABRICATION UTILIZING METALORGANIC MOLECULAR BEAM EPITAXY (MOMBE)

[75] Inventors: Cammy R. Abernathy, Scotch Plains; Fan Ren, Warren, both of N.J.

[73] Assignee: AT&T Bell Laboratories, Murray Hill, N.J.

[21] Appl. No.: 662,550

[22] Filed: Feb. 28, 1991

[51] Int. Cl.⁵ .................... H01L 21/20; H01L 21/36
[52] U.S. Cl. .................................. 437/81; 437/104; 437/105; 437/107; 437/112; 148/DIG. 110
[58] Field of Search ............. 437/81, 104, 105, 107, 437/112; 148/110

[56] References Cited

U.S. PATENT DOCUMENTS

| | | | |
|---|---|---|---|
| 4,788,159 | 11/1988 | Smith | 437/90 |
| 5,010,382 | 4/1991 | Katoh | 357/34 |
| 5,023,687 | 6/1991 | Tanoue et al. | 357/34 |

OTHER PUBLICATIONS

Panish et al., "Very high tin doping of $Ga_{0.47}In_{0.53}As$ by Molecular Beam Epitaxy", Appl. Phys. Lett. 56(12); Mar. 1990; pp. 1137–1139.
Cho; "Impurity Profiles of GaAs Epitaxial Layers doped with Sn, Si, and Ge Grown with Molecular Beam Epitaxy"; J. Appl. Phys., vol. 46, No. 4, Apr. 1975; pp. 1732–1735.
Kawaguchi et al., "Sn Doping for InP and InGaAs Grown by Metalorganic Molecular Beam Epitaxy Using Tetraethyltin"; Journal of Crystal Growth 95 (1989) 181–184.
Chemtronics, G. J. Davies et al., vol. 3, p. 3 (1988).
J. Electron. Mater., W. T. Tsang, p. 235 (1986).
App. Phys. Let., vol. 55, No. 17, pp. 1750–1752 (Oct. 23, 1989).

Primary Examiner—Brian E. Hearn
Assistant Examiner—Trung Dang
Attorney, Agent, or Firm—G. S. Indig

[57] ABSTRACT

High carrier concentration, as well as abrupt change in such concentration in GaAs-based devices, is the consequence of selection of tin dopant-containing precursor compounds as used during layer growth. Alkyl tin compounds, as used during MetalOrganic Molecular Beam Epitaxy, are of particular value in the growth of pnp heterojunction bipolar transistors, likely in conjunction with other devices in large scale integrated circuits.

12 Claims, 2 Drawing Sheets

GAAS DEVICE FABRICATION UTILIZING METALORGANIC MOLECULAR BEAM EPITAXY (MOMBE)

BACKGROUND OF THE INVENTION

1. Technical Field

The invention relates to gallium arsenide based devices-devices including one or more regions of GaAs, AlGaAs, InGaAs. Primary use is in integrated circuits with function dependent upon electronic, photonic or hybrid properties. A significant category of electronic circuits incorporates heterojunction bipolar transistors having n-doped base regions.

2. Description of the Prior Art

It has been decades since the first confident prediction that silicon would yield to compound semiconductors, III–Vs, II–VIs, as well as ternaries and quaternaries, resulting in activity often provoked by the particularly favorable properties of GaAs and variants. (Use of the designation "GaAs" herein is intended to encompass such variants as including e.g. AlGaAs, InGaAs as well as higher order compositions containing sufficient retained Ga and As to be equivalent to the approximately 45 mol % GaAs as required for assurance of direct bandgap and related device properties.) The prediction largely concerned fundamental characteristics, in large measure due to direct bandgap $-\approx 1.4$ electron volts for the binary material; a value which can be altered to suit device needs by incorporation of other elements in group III or V sites. Operational advantages relative to silicon were correctly appreciated as offering significantly increased speed of operation as well as versatility in operating wavelength extending to photonic.

Failure for such GaAs-based devices to broadly supplant silicon is to large extent based on a now-familiar economic pattern. Significant cost entailed switching to the new material—in equipment design/replacement and in retraining of workers provoked effort to stay with silicon. Intensive worldwide effort has yielded ever-improving silicon devices with realization of properties previously expected to require substitution by GaAs. With respect to most prevalent LSI/VLSI structures, as exemplified by e.g. megabit and larger capacity chips, the likely correct view is to continued dominance of silicon.

Fundamental properties of GaAs, however, suggest substitution for silicon in specialized device classes. Present use in radiation detectors, e.g. in radar detectors, is based on speed—on response time which in present GaAs devices may be of the order of 60 GHz as compared with speeds of 2–4 GHz as offered by similar structures made of silicon. Of course, GaAs offers photonic properties not available by use of silicon. Belated promise of high density integrated laser structures-at this time particularly of Surface Emitting Lasers—increases significance of this aspect.

While GaAs has, to some minor extent, fulfilled such promise, use has been limited by a number of processing and composition limitations.

SUMMARY OF THE INVENTION

Increased flexibility in design of devices, dependent upon one or more regions of GaAs-based material, results from fabrication/growth techniques entailing introduction of n-dopant, tin from any of a specified class of precursor compounds represented e.g. by tetraethyl tin. As introduced in MetalOrganic Molecular Beam Epitaxy (MOMBE), decreased segregation of tin of compositional interfaces permits attainment of abrupt junctions as desired for contemplated devices. As compared with use of elemental tin source material with its generally unacceptable segregation, the new process permits well-controlled n-type carrier concentration into the $10^{19}$ cm$^{-3}$ range without segregation. A similar advantage is realized relative to more common silicon n-doping in which inability to attain such high n-type carrier concentration is due to the fact that silicon becomes amphoteric above $\approx 3 \times 10^{18}$ cm$^{-3}$. An experimentally realized carrier concentration of $1.5 \times 10^{19}$ cm$^{-3}$ may translate into a speed advantage of at least twice relative to Si doping.

A significant aspect of the invention involves circuit elements which gain from the higher n-type carrier concentrations now available. An important category is the HBT Pnp's which gain functional advantage as a consequence of such permitted increased concentration. Higher n-type doping capability permits reduction of thickness of n-type base regions (increased from the $3-5 \times 10^{18}$ cm$^{-3}$ of earlier work, to the $1.5 \times 10^{19}$ cm$^{-3}$ permitted in accordance with the invention, translates into a thickness reduction of about 4x). Carrier transit time through the base region dominates the total transit time of a now-possible Pnp HBT with a resulting device speed improvement of twice. A practical advantage, facilitating fabrication of small design rule integrated circuits, results from lowered contact resistance—an advantage realizable in complementary HBT Npn structures. Integrated circuits containing such complementary Pnp and Npn structures as well as a variety of other devices, are included in the invention. Included circuits may be all-electronic, all-optical, or hybrid.

DETAILED DESCRIPTION

Composition

Figure 1:
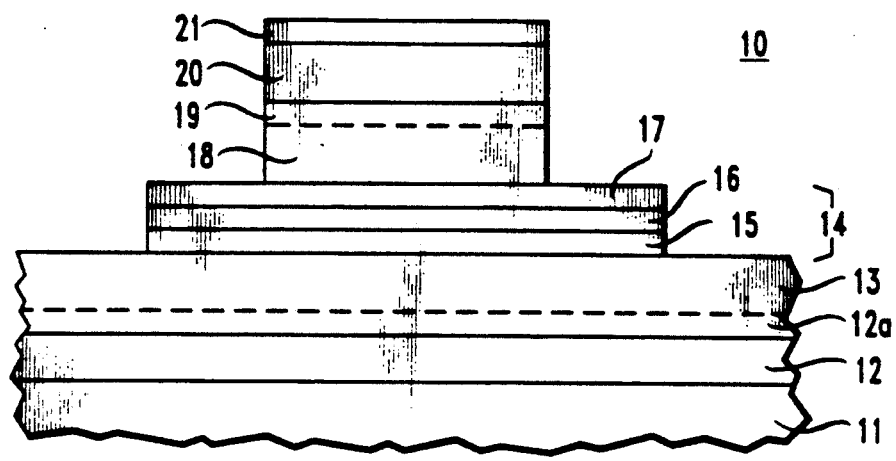
FIG. 1 is a schematic view of a device illustrating a device class of particular relevance in terms of the invention.

Most intense activity in compound semiconductors has concerned GaAs-based material, to which the invention is directed. The inventive teaching is with a view to lattice matching—generally for epitaxial growth on substrates of the prototypical compound GaAs. Device-relevant materials are accordingly generally described as pseudomorphic with the binary material, GaAs. Emphasis on such materials, while largely owing to acknowledged device properties, is in part due to the advanced state of development of GaAs relative to other III–V's. From a practical standpoint, and in terms of promising device categories involving epitaxial layer growth, contemplated materials are those having lattice constants to permit growth of device-functional crystalline perfection. This consideration must take a number of factors into account. For example, requisite perfection, which in any event depends upon intended device function, varies with grown layer thickness—greater mismatch is permitted or sometimes even desired as enhancing device operation due to strain accompanying lattice mismatch. Mismatch is more easily accommodated for thinner layers.

Compositional variation, as permitted by such considerations, is dictated by desired device properties. Contemplated materials generally contain at least 45 at. % gallium, in many instances at least 60 at. %, in the III site. Aluminum is, at this time, the most significant added element. AlGaAs compositions are of larger bandgap than that of the binary composition, with the gap increasing in magnitude with increasing aluminum but going from direct to indirect (with the crossover for otherwise substituted AlGaAs compositions, at about 45 at. % unsubstituted Ga). Indium, the second most probable substitution, itself forms a direct bandgap composition when combined with arsenic, so that its inclusion may permit larger substitution for gallium—e.g. leaving less than the 45 at. % retained gallium noted above.

Consistent with lattice and composition limitations set forth, other substitutions may serve device needs. Indium is a prominent candidate, with amounts of 5-20 at. % (as above, based on total site III occupation) resulting in higher carrier mobility, associated with lowered bandgap-resulting gap value of from $\approx 1.37$ to $\approx 1.2$ ev. Indium substitution is illustrative of likely compromise with a view to device operation. An advantage of GaAs-based devices is the high power capability due to increased bandgap. Specific composition involving choice/amount of indium/aluminum should be with a view to the importance to be placed on the two device properties, carrier mobility as increased by indium (speed/frequency) relative to power capability as increased by aluminum. Device-significant properties owing to processes of the invention, including attainability of high n-type carrier doping concentration, and ability for abrupt change both in concentration and in net carrier type, have been measured in binary, ternary and quaternary combinations of (Ga,Al,In) (As,P). Such compositions, including minor amounts of deliberately added or permissibly included additional elements providing they meet other requirements as set forth, are considered descriptive of materials of relevance to the inventive teaching.

Important use of the invention is dependent upon AlGaAs compositions. Attention to this GaAs-based class of compositions is largely due to increased bandgap with its various device implications. Co-filed U.S. application Ser. No. 07/662,549, hereby incorporated by reference, describes and claims fabrication of aluminum-containing compositions, e.g. AlGaAs compositions that enjoy a number of advantages. That related application depends on a particular category of aluminum-source materials-coordinatively saturated compositions of sufficient vapor pressure to satisfy MOMBE and other requirements. Examples are trimethylamine alane and ethyl and butyl homologs. Absence of Al-C bonding in the source avoids introduction of elemental carbon with the aluminum. Carbon is a p-type dopant, and its avoidance facilitates production of controllable conductivity-particularly in n-type and intrinsic conductivity material. Since such precursor compositions, specified in the co-filed application, do not form volatile Al-O species, unwanted introduction of oxygen is avoided. Oxygen incorporation is of consequence both in electronic and optical devices-in the former it decreases n-carrier concentration to affect gain; in the latter it serves as a non-radiative recombination center, e.g. to reduce brightness.

Methods of this co-filed U.S. application are clearly preferred for aluminum-containing species of this invention. Use was made of such methods in the fabrication of aluminum-containing regions of devices described in the Examples.

PROCESSING CONSIDERATIONS

To a great extent, the invention gains by use of the described processing—particularly with regard to dopant introduction and associated material growth (usually layer growth). Even process-independent device designs were initially an outgrowth of such processing.

Processing of the invention invariably entails introduction of n-type dopant (of tin) from the category of gas phase source materials indicated, by use of the process here referred to as MOMBE (considered by some as overlapping or alternatively denoted "Gas Source Molecular Beam Epitaxy" or "Chemical Beam Epitaxy"). MOMBE is adequately described in the literature (see, for example, G. J. Davies et al, *Chemtronics*, vol. 3, p. 3 (1988)). It is intended that such references serve as basis for determination of general processing parameters, to the extent that the inventive advance does not otherwise specify (e.g. as dependent upon specific source materials).

Growth of multi-element compositions regarding host material (e.g. AlGaAs) as well as dopant, may be based on MOMBE alone or in combination with one or more different methods for introduction of different elements. MOMBE is, in accordance with the invention, necessarily employed in the introduction of tin. It may serve, also for introduction of one or more of the other required elements as for the host material elements Ga and As. Alternatively, different methods may be used. For example, MBE may serve for introduction of elements other than tin required in the growth of such a layer. Other portions of the device—layers not dependent for function on tin doping—may be grown by MBE or even by MOCVD (the latter by definition operating at substantially higher pressures, and accordingly, generally requiring removal of the device under fabrication from the high vacuum MOMBE chamber). A survey of such processes is set forth in W. T. Tsang, *J. Electron. Mater.*, p. 235 (1986).

While detailed information is to be derived from such references, it is useful to briefly outline the nature of MOMBE. MOMBE combines the gaseous sources of MOCVD with the UHV growth environment of MBE. This combination produces a molecular beam of gaseous molecules which decompose on the heated GaAs substrate surface. In order to maintain molecular flow in the growth chamber, the total pressure in the chamber is maintained at levels $<10^{-3}$ Torr. While MBE, by common definition, uses only elemental sources for the Group III, Group V, and dopant elements, MOMBE can utilize any combination of elemental and gaseous sources, provided that at least one or more of the Group III or dopant elements are supplied via the use of a gaseous source.

Devices/Circuits

Primary value of the invention is realized in present and future state-of-the-art structures-importantly, integrated circuits, at this time built to design rules of $\approx 2$ μm; in the future likely to be of reduced scale—1 μm and submicron, perhaps to one or a few tenths of a micron. Pronounced advantages of the inventive approach are of increasing importance as applied to such structures in that they include increased speed (a driving force toward reduced scale) as well as the increased power (associated with the increased bandgap of the contemplated GaAs-based materials—a parameter of particular consequence with increased miniaturization).

Description of FIG. 1 is first in generalized terms, and thereafter in terms of two Examples, the first descriptive of a Pnp. (Consistent with general usage the upper case "P" refers to a region of broad band relative to the narrow band suggested by the use of the lower case "p". Also consistent with such use, the designation, e.g. Pnp does not specify position, so that the "P" may be initially or finally grown.) The second Example relates to the complementary structure-to the Npn. As described above, invention-permitted Pnp designs result in speed advantage as due to thinned base regions permitted by increased carrier concentration. Additional operating advantages result from carrier concentration increase. Among these are lowered parasitic resistance, in turn increasing $f_{max}$ (the figure of merit of device frequency as affected by gain—the extrapolation of the maximum available gain v. frequency curve to 0 gain). Low parasitic resistance derives from lowered contact resistance and lowered sheet resistance in the base region. Complementary Npn structures benefit in the same manner from reduced parasitic resistance associated with reduced contact resistance there permitted in emitter and/or collector regions as tin-doped in accordance with the invention.

FIG. 1 is used in description of the "emitter-up" as well as the inverted structure, the "collector-up" device. Description is initially in terms of the former. The device 10 depicted in FIG. 1 consists of substrate 11 supporting successively grown layers 12, serving as sub-collector, collector 13, and base region 14, in turn consisting of layers 15, 16 and 17. It is convenient to describe layer 16 as the functional base layer with embracing layers 15 and 17 (generally compositionally graded) serving as spacer regions (some writers refer to the entirety of region 14 as the base region). Next, the emitter layer 18 is followed by optional layer 19 and finally by layers 20 and 21, the three constituting the emitter contact region in usual nomenclature.

The collector-up device in similar terms consists of substrate 11 followed by emitter contact 12, optional emitter contact layer 12a (layer 12a, if included, is compositionally/conductively graded), emitter layer 13, base layer 14 in turn consisting of the functioning base layer 16 sandwiched between spacer/graded layers 15 and 17, followed by collector layer 18, and finally by the collector contact region made up of layers 20 and 21. The optional graded layer 12a, serving the function of graded layer 19 in the emitter-up structure, is useful as between embracing layers to assure a smooth transition (where, as in preferred embodiments, the embracing layers are of different compositions—e.g. of an AlGaAs composition (layer 18) and of the binary GaAs composition (layer 20)).

Description of this figure is largely in terms of device-function advantage uniquely gained by use of inventive processing-advantage importantly in terms of response time, or more generally in terms of increased operating speed. While certainly of consequence with attention to specific device elements, there is far greater consequence in terms of realizable gain in terms of circuitry, e.g. integrated circuits, entailing other devices. A graphic example entails the HBT Npn structure previously described by the inventors (see vol. 55, no. 17, *App. Phys. Let.*, pp. 1750-2 (Oct. 23, 1989)). This earlier reported work concerns device advantages for p-base Npn structures which derive from facility for increased and controlled p-type doping resulting from carbon doping, again from gaseous source material, e.g. trimethylgallium, in the course of MOMBE growth. As significant as this earlier work is, the overall value is multiplied by combination with complementary devices in accordance with the invention. Operation of circuits, importantly Integrated Circuits, containing both Npn's and Pnp's of improved response time is properly described as synergistic. Stated differently, the invention permits fabrication of integrated circuits of overall performance advantage exceeding the arithmetic sum of that of the two types of devices.

The complementary HBT-containing IC is expected to receive early commercial attention. There are, in addition, well-established functions which are well-satisfied by unipolar device elements (MOS, MESFET, HEMT). Gains are realizable from the invention in terms of such elements themselves (based on lowered contact resistance, or simply on fabrication convenience). Operational advantages are again realized in IC's containing two or more types of elements—in IC's including unipolar devices as well as highly-doped HBT's of the invention.

Figure 2:
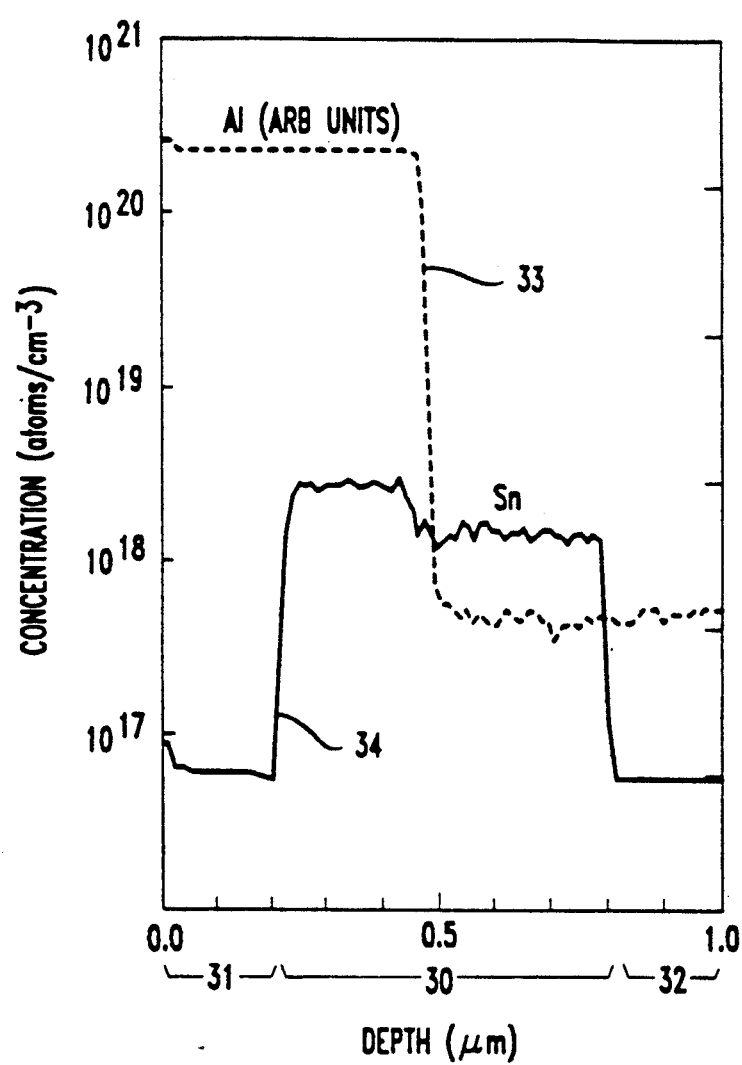
FIG. 2 on coordinates of concentration on the ordinate and depth on the abscissa is referred to in a discussion of relationship as between these two parameters in a finally fabricated junction, with values as yielded by "secondary ion mass spectrometry" during sputter-removal of the GaAs-based material.

FIG. 2 is a plot of dopant level—of tin level—as produced under conditions used in the fabrication of an emitter-up structure discussed in terms of FIG. 1. The abscissa layer depth of 1 μm, made up in turn of high tin doped region 30 embraced between relatively low n-type conductivity regions 31 and 32 is of dimensions appropriate to present state-of-the-art integrated circuits. Broken curve 33, representing aluminum content, in arbitrary units, is included as showing substantial independence of attained tin doping level as between AlGaAs and GaAs regions. The SIMS Profile shown as solid line 34 is of particular consequence in illustrating the abruptness of n-carrier concentration change (1.5-2 orders of magnitude within a layer depth of 500 Å). Other experimental work reveals similar abruptness over a carrier concentration change of about the same size from a maximum of $1.5 \times 10^{19}$ cm$^{-3}$ Sn.

Figure 3:
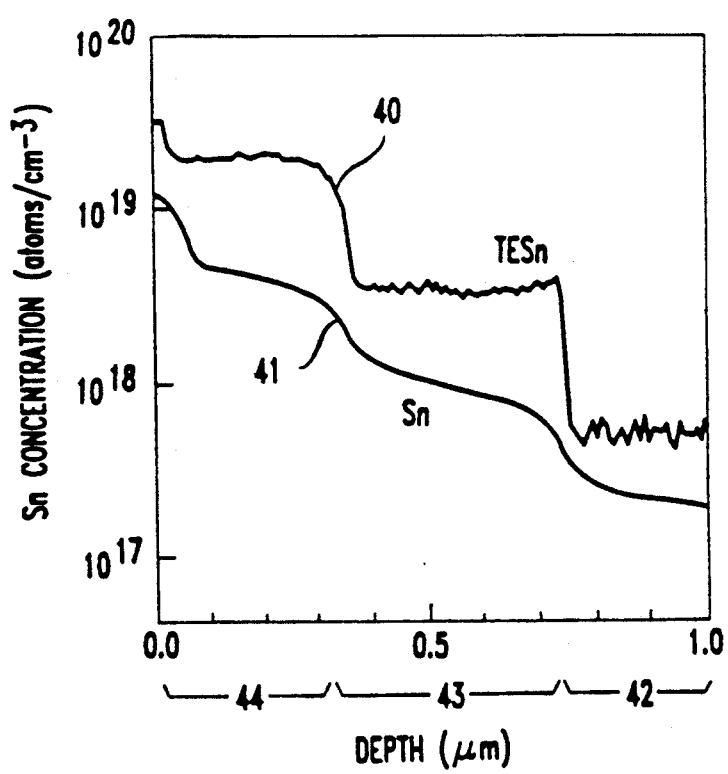
FIG. 3 on the same coordinates of concentration and depth compares junction characteristics as yielded by use of a source of the invention compared with use of elemental tin.

FIG. 3 contains two curves 40 and 41 in terms of tin concentration on the ordinate and layer depth on the abscissa. The purpose of the plot is to illustrate the abruptness of doping level attainable by means of the inventive processes. Experiments corresponding with both curves were designed to yield three levels of concentration of n-type carrier concentration—sublayers 42, 43 and 44 each approximately ⅓ of the total layer depth and each of a uniform carrier density. The objective is substantially achieved for the present processing approach (curve 40) which is representative of tin concentrations of $\approx 5 \times 10^{17}$, $4 \times 10^{18}$ and $2 \times 10^{19}$ for sublayers 42, 43 and 44 in that order. Variation in furnace temperature to yield three corresponding flux levels in the use of a prior art elemental tin source resulted in the sloping regions shown (curve 41).

The form of curve 41 is consistent with earlier experience based on use of elemental tin. Unlike e.g. the interface between layers 42 and 43 as exhibited by the abrupt change on curve 40, increasing tin concentration as yielded from an elemental tin source was not instantaneous with flux change but required some substantial buildup time, so resulting in the sloped regions shown.

Carrier concentration in base region 15, in this instance essentially constant, was about $1.5 \times 10^{19}$ cm$^{-3}$.

EXAMPLE 2

The device fabricated in accordance with this example, again of the configuration shown as FIG. 1 was of Npn configuration and, accordingly, was constituted of the layers identified in discussion of that variation. Fabrication data is again set forth in tabular form.

| | Npn: Growth Temperature = 500° C. | | | | |
|---|---|---|---|---|---|
| Layer (Time:Thickness) | Composition | Source | Source Temp (°C.) | Carrier Gas Flow Rate (SCCM) | Bubbler Pressure (Torr) |
| 21 Emitter Contact (80 sec:300 Å) | $In_xGa_{1-x}As$:Sn | TMI | 15 | 0.8 to 8.0 | 4.2 |
| | | TEG | 11.9 | 4.0 to 0.4 | 6 |
| | | TESn | −6.8 | 6.0 to 13.1 | 6 |
| | | AsH$_3$ | — | 10 | — |
| 20 Emitter Cap (533 sec:2000 Å) | GaAs:Sn | TEG | 11.9 | 4.0 | 6 |
| | | TESn | −6.8 | 6 | 6 |
| | | AsH$_3$ | — | 10 | — |
| 19 Emitter Graded Layer (60 sec:200 Å) | $Al_xGa_{1-x}As$:Sn | TEG | 11.9 | 2.4 to 4 | 6 |
| | | TMAAl | 9.2 | 10 to 1 | 7 |
| | | AsH$_3$ | — | 7.5 to 10 | — |
| | | TESn | 6.8 | 3.4 to 6 | 6 |
| 18 Emitter (240 sec:800 Å) | $Al_{.3}Ga_{.7}As$:Sn | TEG | 11.9 | 2.4 | 6 |
| | | TMAAl | 9.2 | 10 | 7 |
| | | TESn | −6.8 | 3.4 | 6 |
| | | AsH$_3$ | — | 7.5 | — |
| 14 Base (200 sec:700 Å) | GaAs:C | TMG | −9.4 | 4 | 60 |
| | | AsH$_3$ | — | 5.5 | — |
| 13 Collector (1333 sec:5000 Å) | GaAs:Sn | TEG | 11.9 | 4 | 6 |
| | | TESn | −6.8 | 0.3 | 95 |
| | | AsH$_3$ | — | 10 | — |
| 12 Sub-collector (1333 sec:5000 Å) | GaAs:Sn | TEG | 11.9 | 4 | 6 |
| | | TESn | −6.8 | 15 | 95 |
| | | AsH$_3$ | — | 10 | — |

EXAMPLES

EXAMPLE 1

Reference is made to FIG. 1 in detailed description of conditions used in the fabrication of an emitter-up Pnp device. Much of the data is set forth in the form of a table (number designations in column 1 correspond with the reference numbers in the figure).

Experimental evidence set forth in this example served as basis for FIG. 2. As noted, this and other experimental information is representative of both high available n-carrier concentration and abrupt transition as between such high concentration level and lower level n-type, or alternatively, as between n-type and p-type material. Data is set forth in tabular form of the general format of the preceding examples.

| | Pnp: Growth Temperature = 500° C. | | | | |
|---|---|---|---|---|---|
| Layer (Time:Thickness) | Composition | Source | Source Temp (°C.) | Carrier Gas Flow Rate (SCCM) | Bubbler Pressure (Torr) |
| 20 Emitter Contact (441 sec:2000 Å) | GaAs:C | TMG | −9.4 | 5 | 60 |
| | | AsH$_3$ | — | 5 | — |
| 19 Graded Layer (70 sec:200 Å) | $Al_xGa_{1-x}As$:C | TMG | −9.4 | 0.7 to 5 | 60 to 70 |
| | | TMAAl | 9.2 | 10 to 0 | 6 to 1.5 |
| | | AsH$_3$ | — | 25 to 5 | — |
| 18 Emitter (400 sec:800Å) | $Al_{.35}Ga_{.65}As$:C | TMG | −9.4 | 0.7 | 70 |
| | | TMAAl | 9.2 | 10 | 6 |
| | | AsH$_3$ | — | 25 | — |
| 17 Base (109 sec:100 Å) | $Al_{.35}Ga_{.65}As$ | TEG | 11.9 | 1.1 | 6 |
| | | TMAAl | 9.2 | 10 | 6 |
| | | AsH$_3$ | — | 5 | — |
| 16 Base (13 sec:35 Å) | GaAs | TEG | 11.9 | 4 | 6 |
| | | AsH$_3$ | — | 10 | — |
| 15 Base (150 sec:700 Å) | GaAs:Sn | TEG | 11.9 | 4 | 6 |
| | | TESn | −6.7 | 7 | 6 |
| | | AsH$_3$ | — | 10 | — |
| 13 Collector (2000 sec:4000 Å) | GaAs:C | TEG | 11.9 | 1.1 | 6 |
| | | TMG | −9.4 | 0.7 | 70 |
| | | AsH$_3$ | — | 25 | — |
| 12 Sub-collector (882 sec:4000 Å) | GaAs:C | TMG | −9.4 | 5 | 60 |
| | | AsH$_3$ | — | 5 | — |

| | | Growth Temperature = 500° C. | | | |
|---|---|---|---|---|---|
| Time | Layer Composition | Source | Source Temp (°C.) | Carrier Gas Flow Rate (SCCM) | Bubbler Pressure (Torr) |
| 15 min. | GaAs | TEG | 11.9 | 3.0 | 6.0 |
| | | AsH$_3$ | — | 5.0 | — |
| 15 min. | GaAs:Sn | TEG | 11.9 | 3.0 | 6.0 |
| | | TESn | −6.8 | 2.0 | 6.0 |
| | | AsH$_3$ | — | 5.0 | — |
| 15 min. | Al$_{.28}$Ga$_{.72}$As:Sn | TEG | 11.9 | 1.8 | 6.0 |
| | | TMAAl | 9.2 | 10.0 | 6.0 |
| | | TESn | −6.8 | 2.0 | 6.0 |
| | | AsH$_3$ | — | 5.0 | — |
| 15 min. | Al$_{.28}$Ga$_{.72}$As | TEG | 11.9 | 1.8 | 6.0 |
| | | TMAAl | 9.2 | 10.0 | 6.0 |
| | | AsH$_3$ | — | 5.0 | — |
| 30 sec. | GaAs | TEG | 11.9 | 4.0 | 6.0 |
| | | AsH$_3$ | — | 5.0 | — |

The table here set forth represents salient conditions responsible for FIG. 3.

| | | Growth Temperature = 600° C. | | | |
|---|---|---|---|---|---|
| Time | Layer Composition | Source | Source Temp (°C.) | Carrier Gas Flow Rate (SCCM) | Bubbler Pressure (Torr) |
| 15 min. | GaAs:Sn | TEG | 11.9 | 4.0 | 6.0 |
| | | TESn | −6.8 | 14.0 | 6.0 |
| | | AsH$_3$ | — | 10.0 | — |
| 15 min. | GaAs:Sn | TEG | 11.9 | 4.0 | 6.0 |
| | | TESn | −6.8 | 8.0 | 24.0 |
| | | AsH$_3$ | — | 10.0 | — |
| 15 min. | GaAs:Sn | TEG | 11.9 | 4.0 | 6.0 |
| | | TESn | −6.8 | 4.0 | 72.0 |
| | | AsH$_3$ | — | 10.0 | — |

We claim:

1. Process for the fabrication of apparatus including at least one device comprising a GaAs-based crystalline region of composition consisting essentially of GaAs in which Ga may be partially replaced by at least one element selected from the group consisting of Al and In, in which the composition of the said region is substantially pseudomorphic with GaAs, thereby permitting epitaxial growth on substrate material having the lattice dimensions of GaAs, in which said region evidences n-type conductivity, characterized in that such n-type conductivity is at least in part due to tin-doping, in which tin-doping is achieved during MetalOrganic Molecular Beam Epitaxy (MOMBE) entailing decomposition of gaseous source material consisting essentially of alkyl tin, and in which n-carrier concentration is varied during fabrication by at least one processing variation selected from the group consisting of (a) variation in rate of introduction of such source material and (b) variation in rate of decomposition of such source material.

2. Process of claim 1 in which at least 45 at. % of Ga is retained, in which such n-type conductivity is essentially, in its entirety, due to said decomposition, in which the said tin-doping is carried out during MOMBE growth of the said GaAs-based material of the said region, in which variation in rate of introduction is primarily responsible for said carrier variation in n-carrier concentration and in which said alkyl tin consists essentially of tetra-alkyl tin.

3. Process of claim 2 in which rate of introduction of such source material is varied over such limits during such time as to result in the said carrier variation in n-carrier concentration the said carrier variation being a minimum of an order of magnitude within a thickness distance of 0.5 micrometer.

4. Process of claim 3 in which the said thickness distance is of a maximum of 0.1 micrometer.

5. Process of claim 4 in which the carrier concentration attains a concentration of greater than $3 \times 10^{18}$ cm$^{-3}$ at least at some location within the said region.

6. Process of claim 5 in which the said concentration is greater than $7 \times 10^{18}$ cm$^{-3}$.

7. Process of claim 6 in which the said concentration is greater than $1 \times 10^{19}$ cm$^{-3}$.

8. Process of claim 7 in which the said device is a bipolar transistor.

9. Process of claim 8 in which the said structure is a heterojunction bipolar transistor, and in which the said region constitutes at least a functional portion of the base region.

10. Process of claim 9 in which the said apparatus comprises an integrated circuit including at least one additional device differing from that recited.

11. Process of claim 10 in which the additional device is a bipolar transistor having a p-type doped base region.

12. Process of claim 7 in which the said region constitutes a contact region.

* * * * *